United States Patent [19]
McDavid

[11] Patent Number: 4,878,100
[45] Date of Patent: Oct. 31, 1989

[54] TRIPLE-IMPLANTED DRAIN IN TRANSISTOR MADE BY OXIDE SIDEWALL-SPACER METHOD

[75] Inventor: James M. McDavid, Houston, Tex.

[73] Assignee: Texas Instruments Incorporated, Dallas, Tex.

[21] Appl. No.: 317,046

[22] Filed: Feb. 23, 1989

Related U.S. Application Data

[60] Continuation of Ser. No. 145,075, Jan. 19, 1988, abandoned, which is a division of Ser. No. 773,831, Sep. 4, 1985, abandoned, which is a continuation of Ser. No. 418,897, Sep. 16, 1982, abandoned.

[51] Int. Cl.[4] ............ H01L 29/78
[52] U.S. Cl. ............ 357/23.3; 357/90
[58] Field of Search ............ 357/23.3, 23.9, 90, 357/91, 41

[56] References Cited

U.S. PATENT DOCUMENTS

| | | | |
|---|---|---|---|
| 4,092,661 | 5/1978 | Watrous | 357/90 |
| 4,172,260 | 10/1979 | Okabe | 357/23 |
| 4,342,149 | 8/1982 | Jacobs et al. | 357/91 |
| 4,356,623 | 11/1982 | Hunter | 357/23.3 |
| 4,566,175 | 1/1986 | Smayling et al. | 357/23.12 |
| 4,599,118 | 7/1986 | Han et al. | 357/91 |

FOREIGN PATENT DOCUMENTS

| | | | |
|---|---|---|---|
| 53-78180 | 7/1978 | Japan . | |
| 53-78181 | 7/1978 | Japan | 357/23.8 |
| 57-72379 | 5/1982 | Japan . | |

OTHER PUBLICATIONS

IBM Technical Disclosure Bulletin, vol. 15, #6, pp. 1884–1885, by Krich et al., Nov. 1972.

Takeda et al., IEEE Transactions on Electron Devices, vol. ED-29, No. 4, Apr. 1982, pp. 611–618.

*Primary Examiner*—Andrew J. James
*Assistant Examiner*—Mark Prenty
*Attorney, Agent, or Firm*—Carlton H. Hoel; James T. Comfort; Melvin Sharp

[57] ABSTRACT

A transistor for VLSI devices made by the sidewall-spacer method uses a reach-through implant both before and after the sidewall spacer is defined. An arsenic implant self-aligned with the gate prior to the sidewall oxide, then a phosphorus implant and lateral diffusion performed after the sidewall oxide etch creates a reduced impurity concentration and graded junction for the reach-through implanted region beneath the oxide sidewall spacer. An arsenic implant after the sidewall spacer is in place provides heavily-doped low-resistance source/drain regions.

2 Claims, 3 Drawing Sheets

10 16 12 17 16 17 N+ 14 N+ 14 17 18 18 19 19 13 15b 15b 15a 15a P 11

TRIPLE-IMPLANTED DRAIN IN TRANSISTOR MADE BY OXIDE SIDEWALL-SPACER METHOD

This application is a Continuation, of application Ser. No. 145,075, filed Jan. 19, 1988 and now abandoned which is a Divisional of application Ser. No. 773,831, filed Sept. 4, 1985 now abandoned which is a Continuation of application Ser. No. 418,897, filed Sept. 16, 1982 now abandoned.

BACKGROUND OF THE INVENTION

This invention relates to manufacture of insulated-gate field effect transistors, and more particularly to short-channel transistors having drain-to-channel interface made by the sidewall spacer method.

A high-performance insulated gate field effect transistor using oxide sidewall-spacer technology to provide a lightly-doped drain-to-channel interface is disclosed by Tsang et al in IEEE Journal of Solid-State Circuits, April 1982, p. 220. This structure is advantageous for short channel transistors as needed in VLSI devices such as 256K-bit or 1-Megabit memory chips, for example. Small geometry transistors introduce a variety of problems including short channel Vt effects, low breakdown voltage and hot carrier generation which produce substrate and gate currents. The oxide sidewall-spacer technology tends to avoid some of these effects by reducing the electric field at the drain end of the transistor. That is, the devices tend to reduce the effects of hot electrons associated with high electric fields at high implant concentration gradients (implant boundaries). Problems are introduced in fabrication to these devices, however, due to the etching process for creating the sidewall spacer. Also, the implant used to close the gap beneath the sidewall spacer results in a doping level higher than desired and the junction is not graded to the extent desired. Further, phosphorous can be unintentionally introduced from the multi-level insulator, and this produces a junction ahead of the arsenic-doped junction because phosphorous diffuses faster. Alternatives to the Tsang et al process were disclosed by Takeda et al at p. 245 of Journal of Solid State Circuits, April 1982, but none of these was suitable for high-performance dynamic RAMs. Arsenic is needed for the N+ source/drain regions so that the sheet resistance will be low. However, the arsenic implant previously used for the gap-closing implant is not acceptable because of the steep junction grading. This steep grading results in high electric fields which enhance impact ionization and hence produce high substrate and gate currents. The prior configuration also gives high overlap capacitance.

In prior application Ser. No. 412,753, filed Aug. 30, 1982 by Smayling and Duane, assigned to Texas Instruments and now U.S. Pat. No. 4,566,175, a lightly-doped drain transistor is disclosed which avoids some of the problems in the Tsang et al and the Takeda et al devices by using a fast diffusing (phosphorus) light implant and a slowly-diffusing (arsenic) heavy implant, both after the sidewall spacer is defined, so that the field gradients are reduced, yet the process is simplified. However, the control of phosphorus diffusion and sidewall sapcer length are critical in this process.

It is the principal object of this invention to provide improved short-channel MOS transistors for VLSI semiconductor devices, particularly made by a process of less critical control requirements. Another object is to provide an improved transistor employing oxide sidewall spacer technology.

SUMMARY OF THE INVENTION

A transistor for VLSI devices made by the sidewall-spacer method uses a reach-through implant both before and after the sidewall spacer is defined. An arsenic implant self-aligned with the gate prior to the sidewall oxide, then a phosphorus implant and lateral diffusion performed after the sidewall oxide etch creates a reduced impurity concentration and graded junction for the reach-through implanted region beneath the oxide sidewall spacer. An arsenic implant after the sidewall spacer is in place provides the high concentration source/drain regions.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
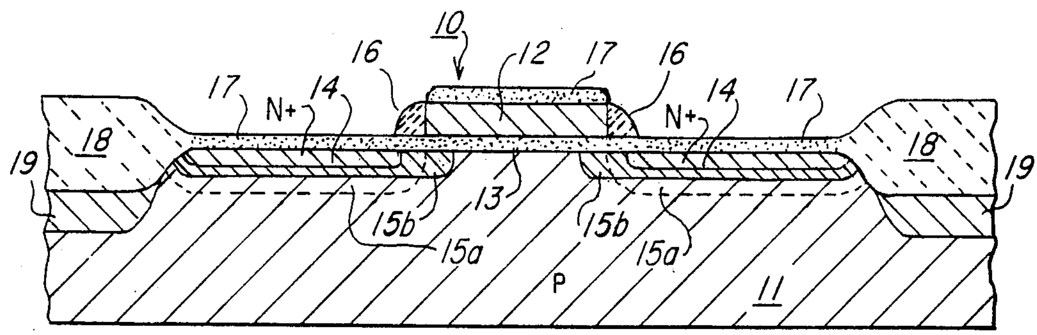
FIG. 1 is a greatly enlarged elevation view in section of a transistor in a small part of a semiconductor ship, made according to the invention.
Figure 2:
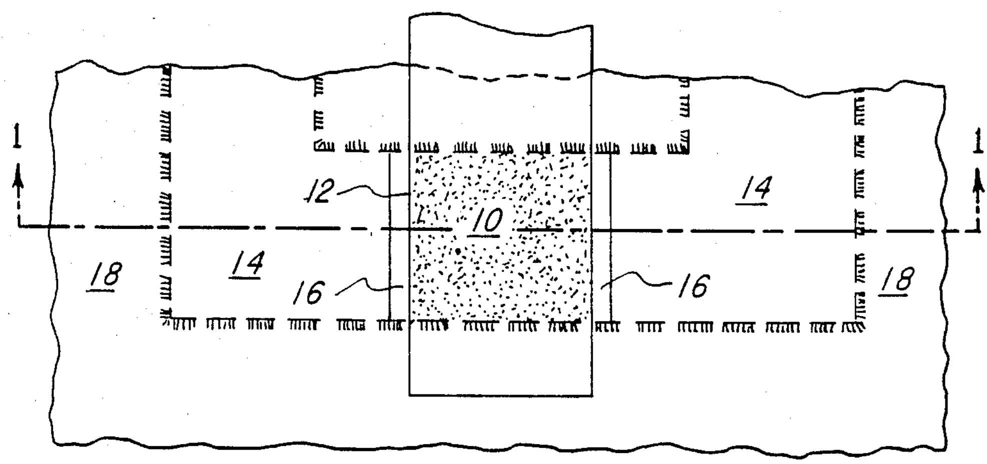
FIG. 2 is a plan view of the part of the chip of FIG. 1.

Referring to FIG. 1, an MOS transistor 10 according to the invention, shown formed in a silicon substrate 11, consists of a polysilicon gate 12, a thermal silicon oxide gate insulator 13, and heavily-doped N+ source/drain regions 14. According to the invention lightly-doped phosphorus-diffused N− regions 15*a*, and lightly-doped arsenic-implanted N− regions 15*b*, with graded junctions or transitions from N− to P, fill in the gaps between the N+ source/drain regions 14 and beginning of the channel beneath the edges of the gate 12. Relatively thick sidewall oxide segments 16 on the sidewalls of the polysilicon gate 12 are employed to create this spacing or gap between the heavily-doped source/drain N+ regions 14 and the gate so that the transistor can have shallow, lightly-doped source and drain regions 15*a* and 15*b* adjacent the channel. These sidewall segments 16 can be silicon oxide, or other deposited insulator such as silicon nitride. A cap of thermal silicon oxide 17 covers the exposed silicon surface of the source/-drain regions 14 and the gate 12. A thick thermal field oxide 18 surrounds the transistor area, with a P+ channel stop 19 beneath the field oxide as set forth in U.S. Pat. No. 4,055,444, issued to G. R. Mohan Rao, assigned to Texas Instruments.

Although not shown in FIG. 1, the transistor 10 would have metal-to-poly or metal-to-silicon contacts and interconnections to make electrical connection to the source, drain and gate; the metallization is insulated from the face of the chip 11 by a multilevel insulator as is conventional. The transistor 10 is part of a VLSI integrated circuit containing many thousands of similar transistors to provide a memory or microcomputer device, for example, as shown in U.S. Pat. Nos.

4,239,993, 4,314,362, 4,074,351 or 3,991,305. Instead of the single-level polysilicon transistor 10, a double-level poly one-transistor cell as shown in U.S. Pat. No. 4,240,092 could use the process of the invention, in which case an N+ region 14 and N− regions 15*a* and 15*b* would be formed on only one side of the gate 12, and the gate 12 would be second-level poly instead of first-level, as will be discussed with reference to FIG. 4.

The circuitry formed on the silicon bar 11, containing perhaps 256K or more memory cells on a bar less than 200 mils on a side (depending upon the minimum line resolution which determines density) is mounted in a standard dual-in-line plastic package, for example, to complete the device. The transistor shown in the Figures would be a very minute part of this bar, perhaps only about one-tenth mil wide.

Figure 3A:
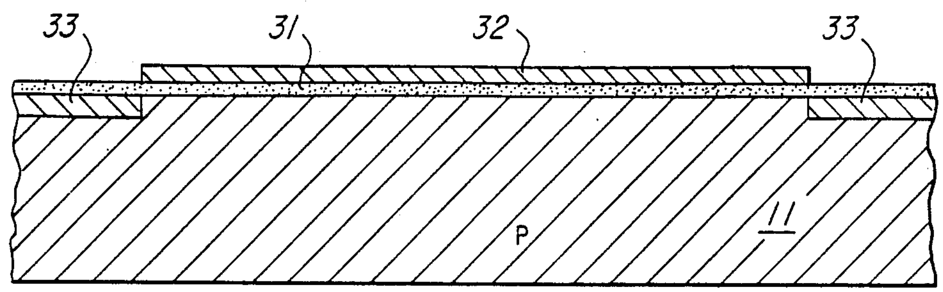
FIGS. 3*a*–3*d* are elevation views in section of the part of the chip corresponding to FIG. 1 at various stages in manufacture.

Turning now to FIGS. 3*a*–3*d*, a process for making the transistor according to the invention will be described. The starting material is a slice of P type monocrystalline silicon typically four inches in diameter, cut on the <100> plane, of a resistivity of about ten ohm-cm, or alternatively P− epi on a P+ substrate. In the Figures the portion shown of the bar 11 represents only a very small part of one bar or chip, which in turn is a very small part of the slice. One slice contains several hundred bars 11. After appropriate cleaning, the slice is oxidized by exposing to pyrogenic in a furnace at a elevated temperature of 900° C. to produce an oxide layer 31 over the entire slice of a thickness of about 350 Å. Next, a layer 32 of silicon nitride of about 1300 Å thickness is formed over the entire slice by exposing to an atmosphere of dichlorosilane and ammonia in a reactor. A coating of photoresist is applied to the entire top surface of the slice, then exposed to ultraviolet light through a mask which defines the desired pattern of the thick field oxide 18 and the P+ channel stops 19. The resist is developed, leaving areas where nitride is then removed by etching the exposed part of the nitride layer 32 but leaving in place the oxide layer 31, as seen in FIG. 3*a*.

Using photoresist and nitride as a mask, the slice is subjected to a boron implant step to produce the channel stop regions in unmasked regions 33 of the silicon. The regions 33 will not exist in the same form in the finished device, because silicon is consumed in the field oxidation procedure. Usually the slice is subjected to a heat treatment after implant, prior to field oxide growth, as set forth in the above-mentioned U.S. Pat. No. 4,055,444.

Figure 3B:
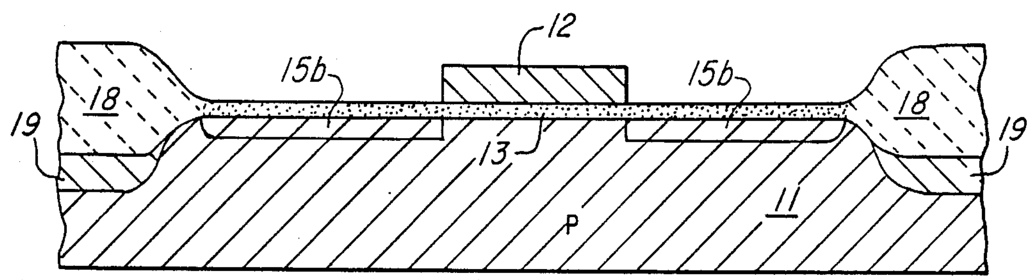

The next step in the process is the formation of field oxide 18 by subjecting the slices to steam or an oxidizing atmosphere at about 900° C. or above for perhaps ten hours or more. This causes a thick field oxide layer 18 to be grown as seen in FIG. 3*b*, extending into the silicon surface as silicon is consumed, with the remaining part of the nitride layer 32 masking oxidation. The thickness of this layer 18 is about 8000 Å, part of which is above the original surface and part below. The boron doped P+ regions 33 formed by implant are partly consumed, but also diffuse further into the silicon ahead of the oxidation front to produced P+ field stop regions 19 which are much deeper than the original regions 33.

Next the remaining nitride layer 32 is removed by etchant which attacks nitride but not silicon oxide, then the oxide 31 is removed by etching the exposed silicon cleaned. The oxide layer 13 is grown by thermal oxidation, to a thickness of about 400 Å.

As also seen in FIG. 3*b*, a layer of polycrystalline silicon and/or moly silicide is deposited over the entire slice in a reactor using standard techniques to a thickness of about 5000 Å. This polysilicon layer is patterned by applying a layer of photoresist, exposing to ultraviolet light through a mask prepared for this purpose, developing, then etching the exposed polysilicon to define the gate 12 and like interconnections.

According to the invention, a first arsenic implant is performed just after the gate 12 is defined, producing the lightly-doped region 15*b*. The dosage is about $10^{12}$ per sq cm. Later heat treatments will cause this implanted arsenic to diffuse somewhat, but the low dosage and the fact that arsenic is slow-diffusing will minimize the overlap effect. An implant dosage of about $100^{11}$ produces almost no measurable effect, whereas an implant dosage of about $10^{13}$ starts to exhibit impact ionization, so the dosage of about $10^{12}$ is used for this implant.

Figure 3C:
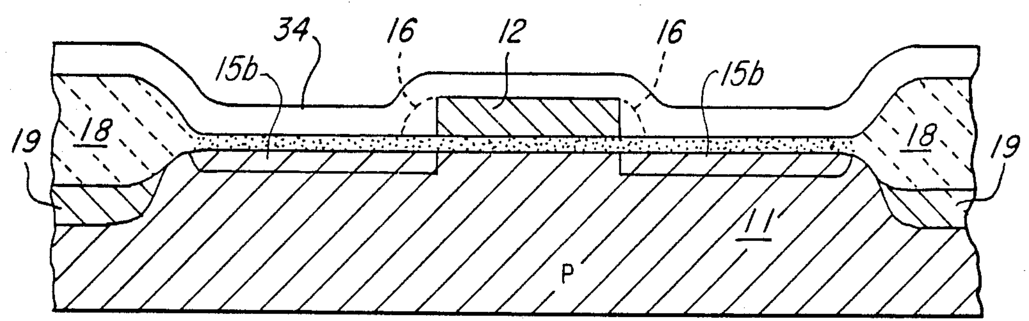

Referring to FIG. 3*c*, a layer 34 of oxide is formed over the face of the slice to ultimately provide the material for the sidewall segments 16. This layer 34 can be of the low-temperature chemical vapor deposition type, for example, as commonly used for multilevel insulators. The layer 34 is subjected to a directional or anisotropic etch using reactive ion etching or a plasma etch as in U.S. Pat. No. 4,297,162, for example, to remove all of the layer 34 on horizontal surfaces and leave the vertically-oriented segments like the sidewall segments 16 adhered to the sides of the gates 12.

Figure 3D:
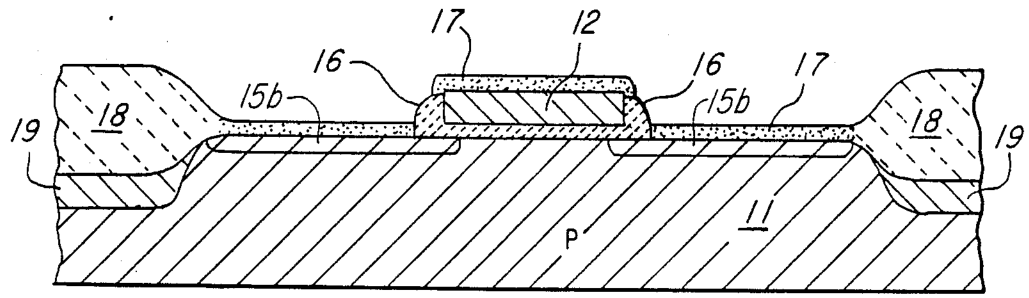

As seen in FIG. 3*d*, the thermal oxide 17 is grown on the exposed silicon or polysilicon surfaces to avoid outdiffussing of phosphorous and implant damage on the silicon surface.

A second arsenic implant at a much higher dosage of perhaps $10^{16}$ per cm sq is now performed to create the N+ regions 14, using the polysilicon 12 and its underlying oxide 13, along with the sidewall oxide segments 16, as a self-align mask. An intermediate dosage phosphorous implant to a dosage of about $10^{14}$ per cm sq is also performed at this point to produce the regions 15*a*. A high temperature treatment anneals implant damage and causes some lateral diffusion to create the "reach-through" N-region 15*a* as seen in FIG. 1. Alternatively, the phosphorus may be implanted first, followed by a heat treatment to drive it in to create the region 15*a*, and then the arsenic implanted to create the region 14, followed by a much shorter heat treatment for anneal, so that the diffusion of arsenic beneath the sidewall spacer 16 is minimized.

A thick layer of silicon oxide is deposited over the entire slice by decomposition of silane at a low temperature, about 400° C. This layer insulates the metal layer from the layer of polycrystalline silicon and other areas of the face of the bar, and is referred to as multilevel oxide.

The multilevel oxide layer is now patterned by a photoresist operation which exposes holes for what will be metal-to-poly or metal-to-silicon contacts. Metal contacts and interconnections are made in the usual manner by depositing a thin film of aluminum over the entire top surface of the slice then patterning it by a photoresist mask and etch sequence, leaving the metal contacts or strips and other metal elements. A protective overcoat is then deposited and patterned to expose the bonding pads, and the slice is scribed and broken into individual bars which are packaged in the customary manner.

Figure 4:
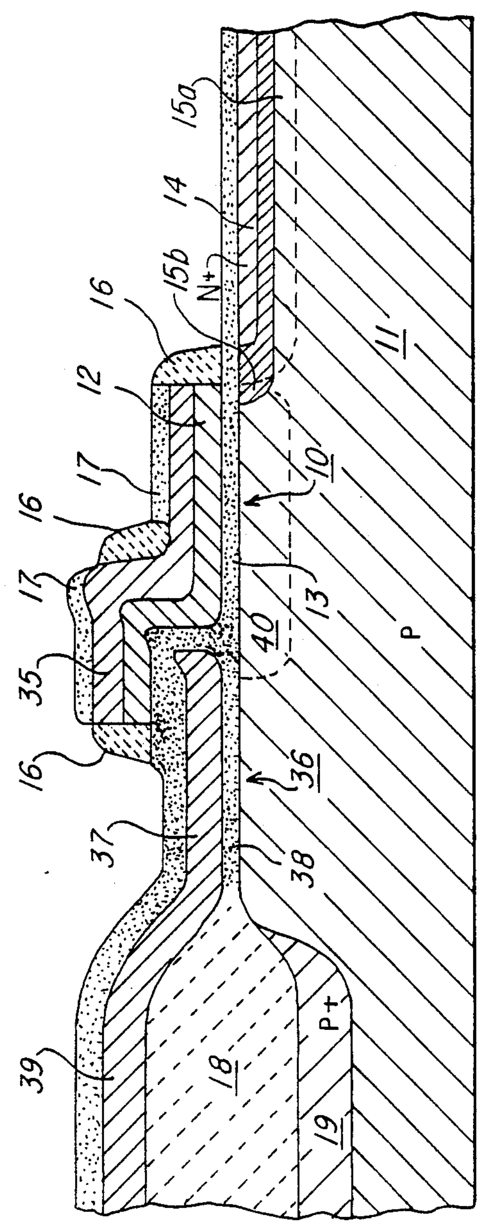
FIG. 4 is an elevation view in section as in FIG. 1 for another embodiment of the invention.

Referring to FIG. 4, an embodiment of the invention is shown in which the transistor 10 is an access transistor for a one-transistor dynamic RAM cell of the double-level poly type as in U.S. Pat. No. 4,240,092. The gate of the transistor 10 includes a layer 12 of polysilicon and an overlying layer 35 of molybdenum silicide. Sidewall oxide 16 exists at all vertical or steep steps. A storage capacitor 36 is created by a layer 37 of first-level polysilicon insulated from the substrate 11 by thin thermal silicon oxide 38, and the layer 37 is connected to a Vdd bias by strip 39 extending over the field oxide 18. A lightly-doped P-implanted region 40 is used to establish the desired threshold voltage. The arsenic-doped region 14 provides the drain of the transistor 10 as in FIG. 1, but the source is defined by the inverted region beneath the capacitor plate 37. The lightly-doped N− regions 15*a* and 15*b* provide the graded reach-through region beneath the sidewall oxide 16 as described above.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A field-effect transistor comprising a gate on a face of a semiconductor body, a channel beneath the gate, a heavily-doped drain region in said face spaced from the channel, first and second lightly-doped regions in the gap between the drain region and the channel, and a sidewall-spacer oxide segment above said gap, the impurity in said heavily-doped region being at a much higher doping level and diffused into the semiconductor body to a much lesser extent than the impurity in said lightly-doped regions, the impurities of the first and second regions being of differing diffusion coefficient and doping level providing a graded junction.

2. A device according to claim 1 in which the semiconductor body is P type silicon, the impurity in the heavily-doped region is arsenic, and the impurity in the lightly-doped regions are arsenic and phosphorous, to provide an N-channel transistor.

* * * * *